(12) United States Patent
Kim et al.

(10) Patent No.: US 6,645,849 B2
(45) Date of Patent: Nov. 11, 2003

(54) METHOD FOR MANUFACTURING SEMICONDUCTOR DEVICE FOR SUPPRESSING DETACHMENT OF CONDUCTIVE LAYER

(75) Inventors: Sung-Bong Kim, Suwon (KR); Joo-Young Kim, Yongin (KR); Min-hwan Lim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/054,569

(22) Filed: Jan. 22, 2002

(65) Prior Publication Data

US 2002/0089061 A1 Jul. 11, 2002

Related U.S. Application Data

(62) Division of application No. 09/791,908, filed on Feb. 22, 2001.

(30) Foreign Application Priority Data

Oct. 10, 2000 (KR) ......................................... 2000-59459

(51) Int. Cl.[7] .............................................. H01L 23/485
(52) U.S. Cl. ...................... 438/624; 438/628; 438/644; 438/652
(58) Field of Search ................................ 438/597, 618, 438/622, 624, 625–629, 648, 637, 643, 644, 645, 652, 653, 654

(56) References Cited

U.S. PATENT DOCUMENTS

| | | | | |
|---|---|---|---|---|
| 5,354,712 A | * | 10/1994 | Ho et al. ..................... | 438/643 |
| 5,472,912 A | * | 12/1995 | Miller ......................... | 438/643 |
| 5,693,564 A | * | 12/1997 | Yu .............................. | 438/644 |
| 6,211,085 B1 | * | 4/2001 | Liu .............................. | 438/624 |
| 6,436,814 B1 | * | 8/2002 | Horak et al. ................. | 438/637 |
| 2002/0024142 A1 | * | 2/2002 | Sekiguchi .................... | 257/758 |
| 2002/0036309 A1 | * | 3/2002 | Sekiguchi et al. .......... | 257/301 |

OTHER PUBLICATIONS

K. Kikuta et al., Multilayered Planarized Trench–Aluminum (PTA) Interconnection Using Reflow Sputtering and Chemical Mechanical Polishing. IEDM 1993, pp. 285–288.*

M. Tagami et al., Cu Single Damascene Interconnects with Plasma–Polymerized Organic Polymers (k=2.6) for High–Speed, 0.1 Micron CMOS Devices. IEDM 2000, pp. 851–853.*

* cited by examiner

Primary Examiner—Wael Fahmy
Assistant Examiner—Anh Duy Mai
(74) Attorney, Agent, or Firm—Mills & Onello LLP

(57) ABSTRACT

A semiconductor device and a method for manufacturing the semiconductor device are provided in which a lower plug electrically connected with an active region of a wafer has a recession, and a conductive layer has a projection fitted into the recession of the lower plug, so that a contact area between the lower plug and the conductive layer increases without increasing a contact resistance therebetween. Thus, the conductive layer can endure physical impacts applied in the formation of the conductive layer itself and in subsequent integration processes, without detaching from the lower plug or the wafer.

12 Claims, 4 Drawing Sheets

METHOD FOR MANUFACTURING SEMICONDUCTOR DEVICE FOR SUPPRESSING DETACHMENT OF CONDUCTIVE LAYER

RELATED APPLICATIONS

This application is a divisional of copending U.S. application Ser. No. 09/791,908, filed on Feb. 22, 2001, the contents of which are incorporated herein in their entirety by reference.

BACKGROUND OF THE INVENTION

1. Field of the Invention

The present invention relates to a conductive landing pad of a semiconductor device which connects a lower plug with an upper interconnection, and more particularly, to a semiconductor device and a method for manufacturing the semiconductor device in which a contact area between a lower plug and a landing pad is increased, so that detachment of the landing pad from the lower plug or a wafer can be prevented.

2. Description of the Related Art

Semiconductor devices have a multi-layered structure, in which upper interconnections are connected to lower plugs by landing pads formed in the interlevel dielectric (ILD) film between the upper interconnection and the lower plug. In general, the landing pad is formed of tungsten having a low resistivity. Unfortunately, tungsten also has strong tensile strength, so it has poor adhesiveness with respect to the ILD film made of silicon oxide, in which the landing pad is located. As a result, the landing pad made of tungsten is liable to be detached from the ILD film or a wafer. This detachment problem is inevitable when the landing pad is formed of a material having poor adhesiveness to the ILD film.

In particular, an ILD film is deposited over lower plugs and etched to form grooves for landing pads. Following this, a conductive material, for example, tungsten, is deposited over the ILD film to fill the grooves, and subjected to mechanical and chemical polishing using a slurry until the ILD film is exposed, thereby resulting in completed landing pads. The slurry used in the mechanical and chemical polishing aggregates by heat generated as the wafer is turned, so that it cannot be easily removed from the wafer. When the mechanical and chemical polishing is continued, the surface of the wafer is scratched and the landing pad formed of tungsten is separated from the ILD film and the lower plugs.

When the formation of the landing pad is completed, the wafer with the landing pad is subjected to washing and drying processes. The drying process is performed by spin drying. "Spin drying" refers to removing water used in the washing process from the wafer surface by centrifugal force generated as the water is turned. Although the landing pads remain in the ILD film through the mechanical and chemical polishing process, it is more likely that the landing pads passed through the mechanical and chemical polishing process are liable to be detached from the wafer surface during the spin drying processes. The separation of the landing pads causes poor electrical connections in the resultant semiconductor device. Furthermore, the detachment of the landing pads becomes serious with an increase in the integration density of semiconductor devices.

To account for the detachment of landing pads, a technique of placing an adhesive layer formed of TiN or TaN, which has excellent adhesiveness to an ILD film, between the ILD film and landing pads formed of tungsten has been suggested. Although the adhesive layer is interposed between the ILD film and the landing pads, the landing pads cannot remain intact in the ILD film through subsequent mechanical and chemical polishing, washing and drying processes, which are carried out after filling grooves for landing pads in the ILD. On the other hand, in order to ensure strong adhesiveness between the landing pads and the ILD film with the adhesive layer, the landing pads must be larger than a predetermined dimension, which restricts the integration density of semiconductor devices.

Another approach used to overcome the detachment of landing pads is to increase the contact area between landing pads and lower plugs by etching a lower insulating layer, in which the lower plugs are to be formed, as well as the ILD film to form grooves for the landing pads. However, this overetching technique needs a lower insulating layer having increased thickness to ensure a sufficient processing margin for deep grooves, so that the aspect ratio of openings for the lower plugs formed in the lower insulating layer increases. In this way, because the grooves for the landing pads are formed over the ILD film and the lower insulating layer, the aspect ratio of the grooves also increases. Such increased aspect ratios cause difficulties in etching the ILD film and the lower insulating layer. In addition, the openings for the lower plugs and the grooves for the landing pads are filled with conductive materials, voids more likely occur within the openings and the grooves. With the increase in the integration density of semiconductor devices, these problems become serious.

SUMMARY OF THE INVENTION

To solve the above problems, it is an objective of the present invention to provide a semiconductor device having a combination of lower plugs and a conductive layer, and a method for manufacturing the semiconductor device, in which separation of the conductive layer from an interlevel dielectric film (ILD) and the lower plugs can be suppressed even when a fine pattern is adopted to increase the integration density of semiconductor devices.

It is another objective of the present invention to provide a semiconductor device having a combination of lower plugs and a conductive layer, and a method for manufacturing the semiconductor device, in which less consideration is needed in etching openings for the lower plugs and grooves for the conductive layer, and prevents occurrence of voids in the lower plugs and the conductive layer.

According to an aspect of the present invention, there is provided a semiconductor device including a first interlevel dielectric (ILD) film having an opening. A diffusion barrier layer is formed along the first ILD film having the opening. A lower plug having a recession is formed in the opening coated with the diffusion barrier layer. The semiconductor device also includes a second ILD film having a groove through which at least the recession of the lower plug is exposed, the second ILD film being formed over the first ILD film. An adhesive layer is formed on the groove of the second ILD film and the recession of the lower plug. A conductive layer is deposited on the adhesive layer to fill the groove of the second ILD film and the recession of the lower plug.

The adhesive layer may be formed on a portion of the recession of the lower plug, or over the recession of the lower plug according to the processing conditions. It is preferable that the diameter of the recession is ¼–½ of the diameter of the opening of the first ILD film.

The lower plug may be formed of a metal, preferably, aluminum, copper or tungsten. The conductive layer may be formed of a metal such as tungsten, copper, aluminum, refractory metal and refractory metal silicide.

According to another aspect of the present invention, there is provided a method for manufacturing a semiconductor device. In accordance with the method, a first interlevel dielectric (ILD) film is formed with an opening over a semiconductor substrate. A diffusion barrier layer is formed along the first ILD film having the opening. A first conductive layer having a recession is formed in the opening of the first ILD film coated with diffusion barrier layer, and a second ILD film having a groove, through which at least the recession of the lower plug is exposed, is formed over the first ILD film. A metal is deposited over the second ILD film having the groove to form an adhesive layer on the groove of the second ILD film and the recession of the lower plug. A conductive layer is formed over the adhesive layer such that the conductive layer fills the groove of the second ILD film and the recession of the lower plug. In the manufacture of the semiconductor device, the first conductive layer is a lower plug, and the second conductive layer is a landing pad.

In another embodiment, the semiconductor device manufacturing method according to the present invention comprises preparing a semiconductor substrate in which an active region is defined. A first interlevel dielectric (ILD) film with an opening, through which the active region is exposed, is formed over the semiconductor substrate. A diffusion barrier layer is formed along the first ILD film having the opening. A first conductive layer is deposited over semiconductor substrate having the diffusion barrier layer, such that the opening of the first ILD film is not completely filled. The first conductive layer and the diffusion barrier layer are etched until the surface of the first ILD film is exposed, thereby resulting in a lower plug having a recession. A second ILD film having a groove, through which at least the recession of the lower plug is exposed, is formed over the first ILD film. A metal is deposited over the second ILD film having the groove to form an adhesive layer on the groove of the second ILD film and the recession of the lower plug. A second conductive layer is formed over the adhesive layer such that the second conductive layer fills the groove of the second ILD film and the recession of the lower plug. The adhesive layer and the second ILD film are etched until the surface of the second ILD film is exposed, so that a landing pad filling the groove and the recession is formed.

The adhesive layer may be formed on a portion of the recession of the lower plug, or over the recession of the lower plug according to the processing conditions. It is preferable that the diameter of the recession is ¼–½ of the diameter of the opening of the first ILD film.

In one embodiment, forming the lower plug includes forming a conductive material layer over the first ILD film having the opening coated with the diffusion barrier layer, such that the opening of the first ILD film is not completely filled. The conductive material layer is etched until the top of the first ILD film is exposed. The conductive material layer can be etched by mechanical and chemical polishing.

In one embodiment, forming the conductive layer includes forming a conductive material layer over the second ILD film coated with the adhesive layer such that the groove of the second ILD film and the recession of the lower plug are completely filled. The conductive material layer is etched until the top of the second ILD film is exposed. The conductive material layer can be etched by either mechanical and chemical polishing or dry etching.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
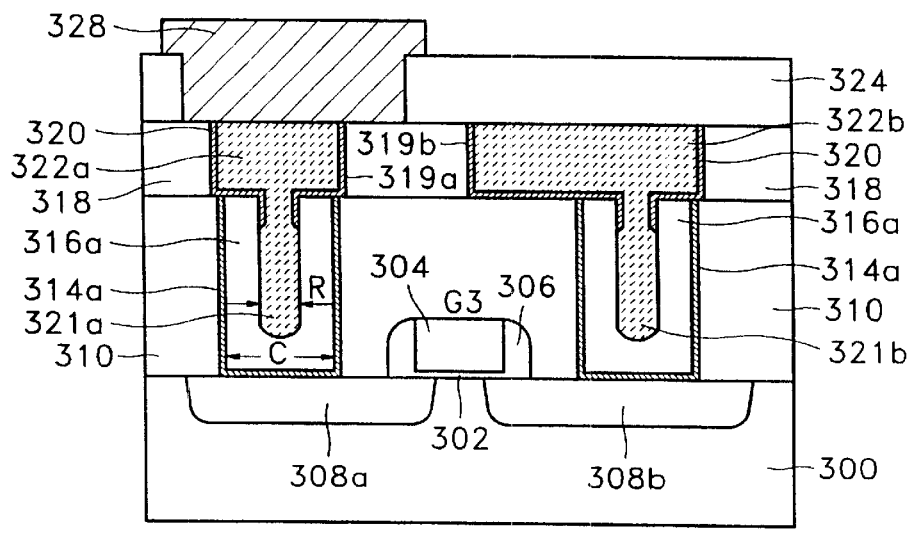
FIG. 1 is a sectional view of an embodiment of a semiconductor device having landing pads, which connect lower plugs and upper interconnection, according to the present invention.

A preferred embodiment of a semiconductor device according to the present invention is shown in FIG. 1. Referring to FIG. 1, a source region 308a and a drain region 308b are defined in a semiconductor substrate 300, and a gate electrode assembly G3 is formed on the semiconductor substrate 300. The gate electrode assembly G3 includes a gate insulating layer 302 formed on the semiconductor substrate 300, a gate electrode 304 made of a conductive material, and a spacer 306 formed on the sidewalls of the gate electrode 304. A first interlevel dielectric (ILD) film 310 is formed over the semiconductor substrate 300 having the gate electrode assembly G3. Openings, which partially expose the source region 308a and the drain region 308b, are formed in the first ILD film 310. A diffusion barrier layer 314a is formed along the inner walls and bottom of the openings. The diffusion barrier layer 314a may be formed of a titanium layer, a titanium nitride layer, a tantalum nitride layer, or a titanium/titanium nitride layer. A lower plug 316a having a recession, as a first conductive layer, is formed in each of the openings coated with the diffusion barrier layer 314a. The diameter R of the recession is ¼–½ of the diameter C of the opening. The first conductive layer, i.e., the lower plug 316a, is formed of a metal, preferably, tungsten, copper or aluminum.

A second ILD film 318 having grooves 319a and 319b, through which at least the recession 317 (see FIG. 4) of the lower plug 316a is exposed, is formed on the first ILD film 310. In particular, one groove 319a of the second ILD film 318, which is located on the left side of FIG. 1, exposes the diffusion barrier layer 314a and the lower plugs 316a, while the other groove 319b of the second ILD film 318, which is located on the right side of FIG. 1, exposes a portion of the first ILD film 310 as well as the diffusion barrier layer 314a and the lower plug 316a. An adhesive layer 320 is coated along the insides of the grooves. In particular, as shown in FIG. 1, as for the groove 319a of the second ILD film 318, the inner sidewalls of the groove 319a, the top of the lower plug 316a, and a portion of the recession 317 (see FIG. 4) are coated with the adhesive layer 320. As for the groove 319b of the second ILD film 318, the inner sidewalls of the groove 319b, the top of the lower plug 316a, and the exposed top of the first ILD film 310 and a portion of the recession 317 (see FIG. 4) are coated with the adhesive layer 320. The adhesive layer 320, which serves to improve adhesiveness between the second IDL film 318 made of an oxide and a second conductive layer for forming a landing pad 322a and a lower interconnection 322b, to be formed in a subsequent step, is formed of a titanium nitride layer or a tantalum nitride layer. The grooves 319a and 319b coated with the adhesive layer 320 and the recessions of the lower plugs 316a are filled with a conductive material, thereby resulting in the landing pad 322a and the lower interconnection 322b each of which has a projection protruding into the lower plugs 316a. The second conductive layer including the landing pad 322a and the lower interconnection 322b is formed of metal, preferably, tungsten, copper, aluminum, refractory metal or refractory metal silicide.

Over the second ILD film 318 with the landing pad 322a and the lower interconnection 322b, a third ILD film 324 having an opening, through which the top of the landing pad 322a is exposed, is deposited. An upper interconnection 328 is formed on the third ILD film 324, filling the opening.

Figure 2:
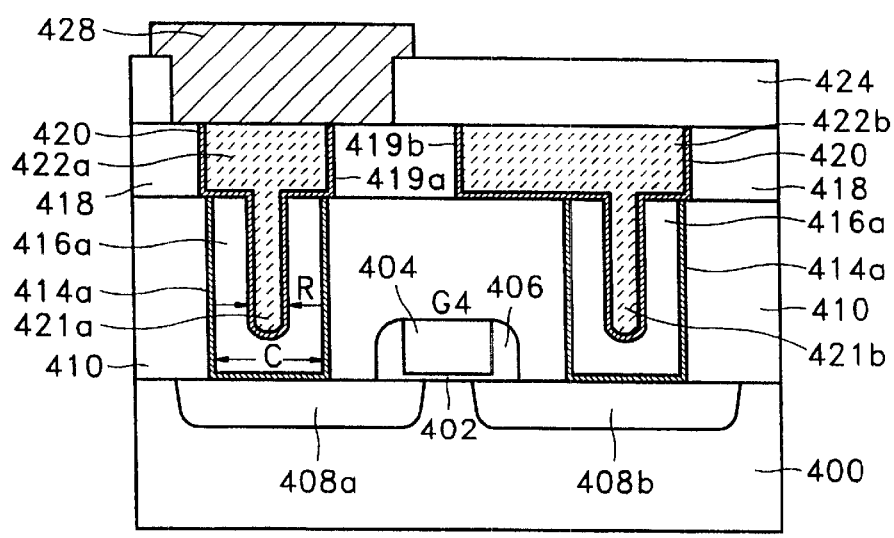
FIG. 2 is a sectional view of another embodiment of a semiconductor device having landing pads, which connect lower plugs and upper interconnection, according to the present invention.

Another embodiment of a semiconductor device according to the present invention is shown in FIG. 2. The semiconductor device shown in FIG. 2 is the same as the semiconductor device shown in FIG. 1, except that an adhesive layer 420 is formed to cover the entire recessions of lower plugs 416b. As shown in FIG. 1, the adhesive layer can be formed on a portion of the recessions of the lower plugs 316b, or on the entire of the recessions of the lower plugs 416b, as in the present embodiment, which depend on the material selected and the technique applied to form the adhesive layer 420. In FIG. 2, reference numeral 400 represents a semiconductor substrate, reference character G4 represents a gate electrode assembly including a gate electrode 404, a gate insulating layer 402 and a spacer 406, reference numeral 408a represents a source region, reference numeral 408b represents a drain region, reference numeral 410 represents a first ILD film, reference numeral 414a represents a diffusion barrier layer, reference numeral 416b represents a first conductive layer, i.e., the lower plugs having recessions, reference numeral 418 represents a second ILD film, reference numerals 419a and 419b represent grooves in the second ILD film 418, reference numeral 420 represents the adhesive layer, reference numerals 421a and 421b represent projections corresponding to the recessions, reference numerals 422a and 422b represent landing pads having the projections 421a and 421b, reference numeral 424 represents a third ILD film, and reference numeral 428 represents an upper interconnection.

An embodiment of a method for manufacturing a semiconductor device according to the present invention is illustrated in FIGS. 3 through 6. Referring to FIG. 1, an insulating layer (not shown) and a conductive material layer (not shown) are deposited over a semiconductor substrate 300 in succession, and patterned into a gate insulating layer 302 and a gate electrode 304, respectively. An insulating layer (not shown) is deposited over the semiconductor substrate 300 having the gate electrode 304, and etched back to form a spacer 306 on each sidewall of the gate electrode 304, thereby resulting in a gate electrode assembly G3. Following this, a source region 308a and a drain region 308b are formed in the semiconductor substrate 100 by ion implantation. Alternatively, after the formation of the gate electrode 304 and before the formation of the spacer 306, the semiconductor substrate 300 having the gate electrode 304 may be lightly doped with impurities. A first ILD film 310 is formed over the semiconductor substrate 300 having the gate electrode assembly G3. A portion of the first ILD film is etched using $CF_4$ and $O_2$ gases to form openings through which the source region 308a and the drain region 308b are exposed.

Figure 3:
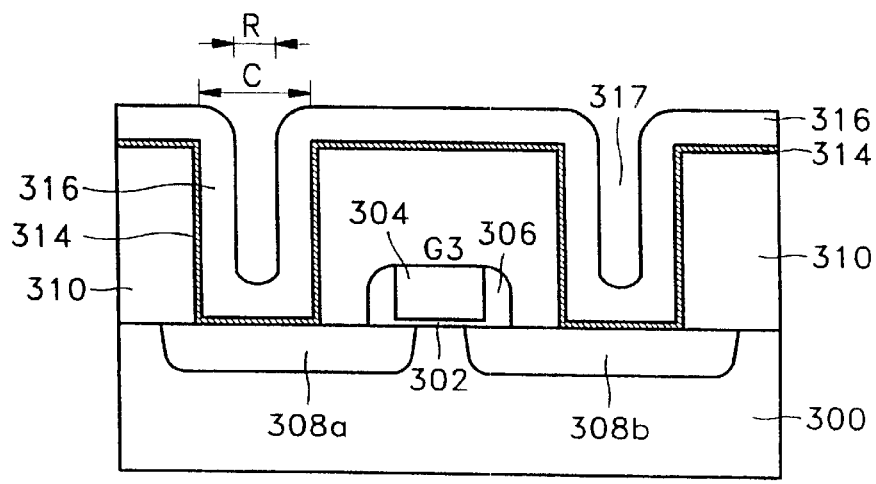
FIGS. 3 through 6 illustrate an embodiment of a method of forming landing pads of a semiconductor device according to the present invention.

A conductive material is deposited over the first ILD film 310 having the openings by chemical vapor deposition or physical vapor deposition to form a diffusion barrier layer 314 with a thickness of 100–1000 Å. The diffusion barrier layer 314 may be formed of a tantalum nitride layer, a titanium nitride layer or a titanium/titanium nitride layer. A first conductive layer 316 is formed along the diffusion barrier layer 314 by chemical vapor deposition or physical vapor deposition, such that a recession 317 remains in the opening, as shown in FIG. 3. Preferably, the diameter R of the recession 317 is ¼–½ of the diameter C of the opening. The first conductive layer 316 is formed of metal, preferably, tungsten, aluminum or copper.

Figure 4:
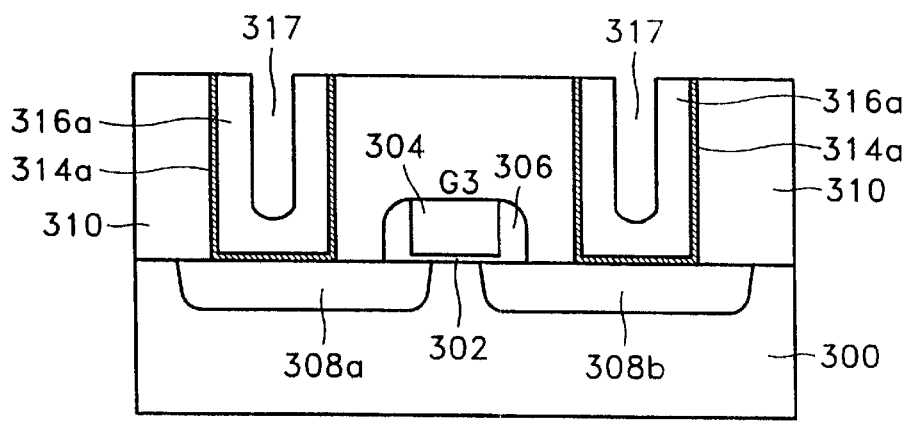

Referring to FIG. 4, the semiconductor substrate 300 with the first conductive layer 316 is subjected to mechanical and chemical polishing until the surface of the ILD film 310 is exposed, so that the lower plugs 316a with the recessions 317 are formed. If an etching back technique is applied, instead of the mechanical and chemical polishing technique, to expose the surface of the ILD film 310, the diffusion barrier layer 314 and the first conductive layer 316 formed on the bottom of the opening are also removed during the etching back process, so that a conductive material such as metal filling the recessions 317 may migrate into the semiconductor substrate 300, thereby causing sparking in the junction near the source region 308a and the drain region 308b. As a result, there arises a problem of leakage current.

Figure 5:
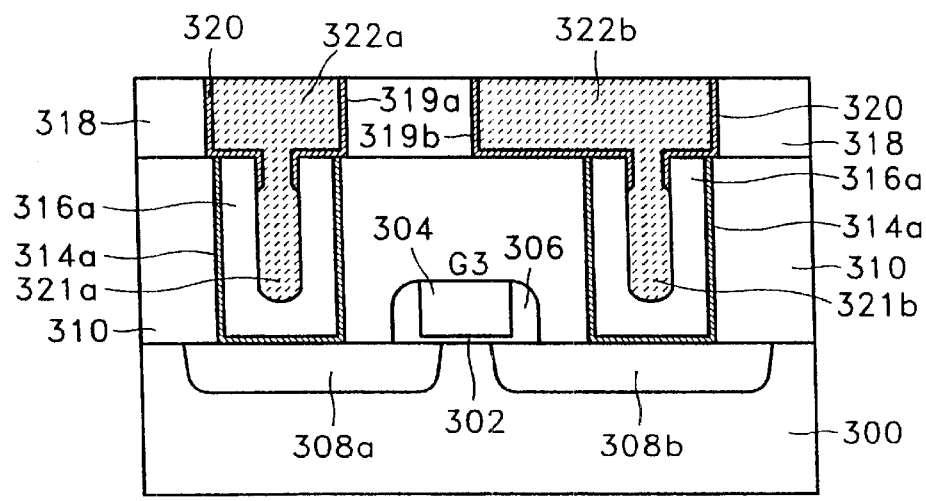

Referring to FIG. 5, a second ILD film 318 is formed over the first ILD film 310 having the lower plugs 316a, and a portion of the second ILD film 318 is removed by photolithography, thereby resulting in grooves 319a and 319b in the second ILD film 318. Following this, an adhesiveness enhancing layer (not shown) is deposited along the second ILD film 318 having the grooves by low-pressure chemical vapor deposition or ionization physical deposition to have a thickness of 100–700 Å. The adhesiveness enhancing layer acts to improve the adhesiveness between the second ILD film 318 and a second conductive layer (not shown) to be formed in a subsequent step. The adhesiveness enhancing layer may be formed of a titanium nitride layer, a tantalum nitride layer or a titanium/titanium nitride layer. When the ionization physical deposition method is applied to form the adhesive enhancement layer, metal such as titanium or tantalum is ionized by plasma, and the resultant metal ions adhere to a wafer installed in an etching apparatus by electric field generated with application of alternating current (AC).

Next, a second conductive layer having a thickness of 3000–6000 Å is deposited over the adhesiveness enhancing layer. The second conductive layer, which fills the grooves of the second ILD 318 and the recessions 317 of the lower plugs 316a, is formed of metal such as tungsten, copper, aluminum, refractory metal or refractory metal silicide. When tungsten is selected as the material of the second conductive layer, $SiH_4$ and $W_6$ gases are used as reaction source gases and the temperature is adjusted in the range of 400–450° C. When aluminum is selected as the material of the second conductive layer, aluminum containing 0.1–0.5% by weight silicon is deposited and heated at a temperature of 450° C. or more. As a result, the recessions 317 and the grooves 319a and 319b of the second ILD film 318 are filled with tungsten or aluminum.

Following this, the second conductive layer and the adhesiveness enhancing layer are removed by dry etching or mechanical and chemical polishing until the top of the second ILD 318 is exposed, thereby resulting in an adhesiveness layer 320, a landing pad 322a and a lower interconnection 322b. The landing pad 322a and the lower interconnection 322b include projections 321a and 321b corresponding to the recessions of the lower plugs 316a.

Figure 6:
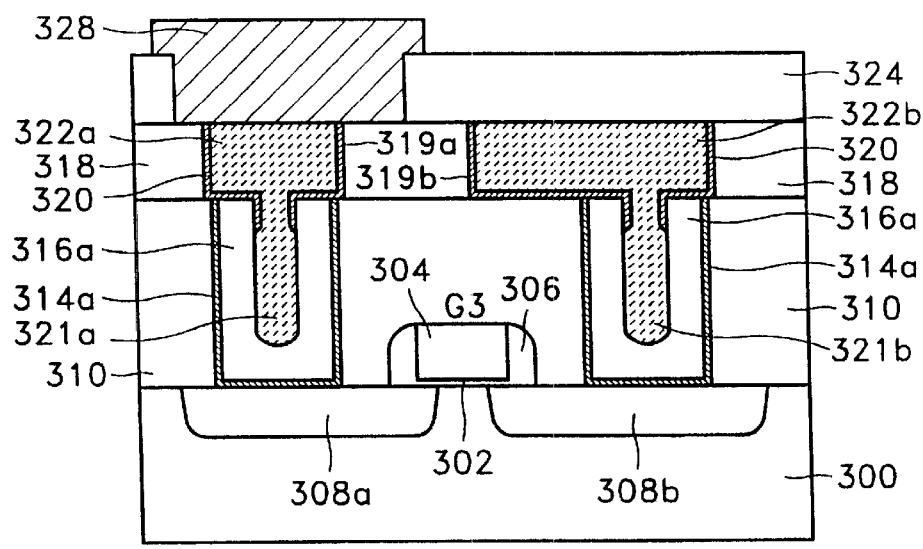

As shown in FIG. 6, a third ILD film 324 is deposited over the second ILD film 318 having the adhesiveness layer 320, the landing pad 322a and the lower interconnection 322b. A portion of the third ILD film 320 is etched to form openings to be an upper metal interconnection. A conductive material such as metal is deposited over the third ILD film 324, filling the openings, and patterned to form an upper metal interconnection 328.

Figure 7:
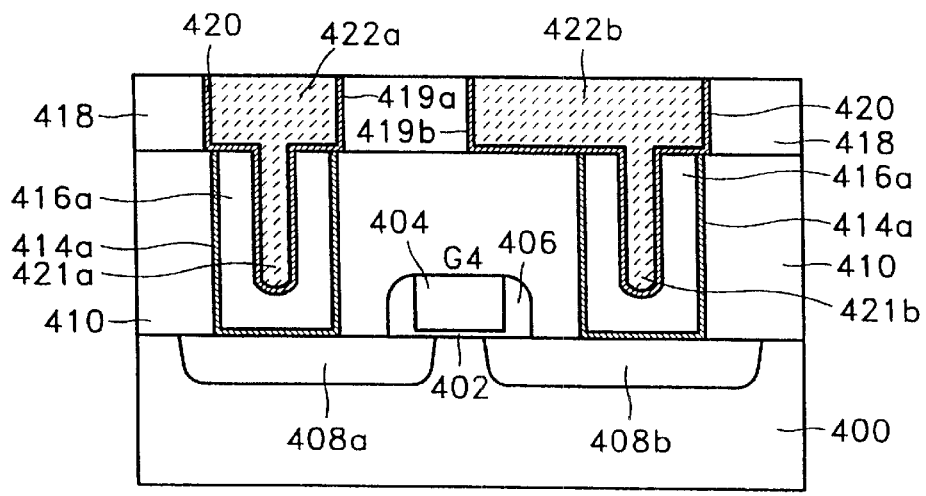
FIGS. 7 and 8 illustrate another embodiment of a method of forming landing pads of a semiconductor device according to the present invention.
Figure 8:
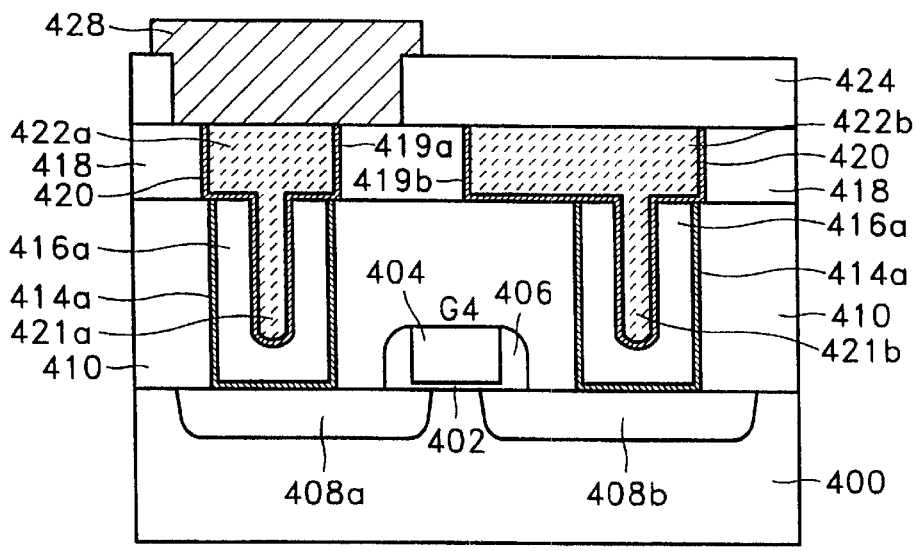

Another embodiment of a method for manufacturing a semiconductor device according to the present invention is illustrated in FIGS. 7 and 8. A gate electrode assembly G4, a source region 408a, a drain region 408b, a diffusion barrier layer 414a, a lower plug 416a, a landing pad 422a, a lower interconnection 422b, first, second and third ILD films 410, 418 and 424, and an upper interconnection 428 are formed through the same processes as those illustrated with reference to FIGS. 3 through 6. Although the same deposition technique is applied to form both the adhesive layers 320 and 420, if the openings of the first ILD film 410, in which the lower plugs 416a are to be formed, are designed to be larger than those for the lower plugs 316a shown in FIGS. 5 and 6, the adhesive layer 420 can be formed over the recessions of the lower plugs 416, unlike the adhesive layer 320 coated on a portion of the recessions of the lower plugs 316a. In this way, the deposition conditions applied to form the adhesive layer 320 shown in FIGS. 5 and 6 can be varied such that the adhesive layer 420 can be formed over the recessions of the lower plugs 416.

As previously mentioned in the above two embodiments, the lower plugs 316a and 416a have recessions, and the landing pads 322a and 422a, or the lower interconnections 322b and 422b have projections fitted into the recessions of the lower plugs 316 and 416a, so that the contact area between the lower plugs 316a and 416a, and the landing pads 322a and 422a or the lower interconnections 322b and 422b increases, thereby strengthening the combination of the landing pads 322a and 422a or the lower interconnections 322b and 422b, and the lower plugs 316a and 416a. For this reason, after a conductive material filling the openings of the second ILD films 318 and 418, and the recessions of the lower plugs 316a and 416a are polished or etched back to form the landing pads 322a and 422a or the lower interconnections 322b and 422b, or even when the semiconductor substrate having the landing pads 322a and 422a or the lower interconnections 322b and 422b are subjected to subsequent integration processes, such as washing and drying processes, detachment of the landing pads 322a and 422a, or the lower interconnections 322b and 422b from the lower plugs 316a and 416a, or the semiconductor substrates 300 and 400 can be suppressed.

Although the lower plugs 316a and 416 have recessions, the recessions are filled with the landing pads 322a and 422a, or the lower interconnections 322b and 422b, so that there is no increase in contact resistance between the lower plugs 316a and 416a, and the landing pads 322a and 422a or the lower interconnections 322b and 422b.

In addition, the openings formed in the first ILD films 310 and 410 are completely filled with conductive material through two stages, i.e., by the lower plugs 316a and 416a, and then by the landing pads 322a and 422a, or the lower interconnections 322b and 422b, so that occurrence of voids in filling the openings of the first ILD films 310 and 410 can be prevented.

While this invention has been particularly shown and described with reference to preferred embodiments thereof, it will be understood by those skilled in the art that various changes in form and details may be made to the described embodiments without departing from the spirit and scope of the invention as defined by the appended claims.

What is claimed is:

1. A method for manufacturing a semiconductor device, comprising:
    forming a first interlevel dielectric (ILD) film with an opening over a semiconductor substrate;
    forming a diffusion barrier layer along the first ILD film having the opening;
    forming a lower plug in the opening of the first ILD film coated with the diffusion barrier layer, the lower plug having a second single diameter and having substantially vertical sidewalls and a substantially flat top surface that is substantially level with a top surface of the first ILD film;
    forming a second ILD film over the first ILD film, the second ILD film having a groove through which at least the recession of the lower plug is exposed;
    depositing over the second ILD film having the groove a metal to form an adhesive layer on the groove of the second ILD film and the recession of the lower plug; and
    forming a conductive layer over the adhesive layer to fill the groove of the second ILD film and the recession of the lower plug, such that the conductive layer includes an upper portion and a protrusion extending vertically underneath the upper portion into the interior of the lower plug, the protrusion having substantially vertical sidewalls substantially parallel to the sidewalls of the lower plug.

2. The method of claim 1, wherein the adhesive layer is formed over one of (i) a portion of the recession of the lower plug and (ii) the recession of the lower plug, depending on the metal deposition conditions.

3. The method of claim 2, wherein forming the lower plug comprises:
    forming a conductive material layer over the first ILD film having the opening coated with the diffusion barrier layer, such that the opening of the first ILD film is not completely filled; and
    etching the conductive material layer until the top of the first ILD film is exposed.

4. The method of claim 2, wherein forming the conductive layer comprises:
    forming a conductive material layer over the second ILD film coated with the adhesive layer such that the groove of the second ILD film and the recession of the lower plug are completely filled; and
    etching the conductive material layer until the top of the second ILD film is exposed.

5. The method of claim 2, wherein the diameter of the recession is $1/4$–$1/2$ of the diameter of the opening of the first ILD film.

6. The method of claim 1, wherein forming the lower plug comprises:
    forming a conductive material layer over the first ILD film having the opening coated with the diffusion barrier layer, such that the opening of the first ILD film is not completely filled; and etching the conductive material layer until the top of the first ILD film is exposed.

7. The method of claim 6, wherein the conductive material layer is etched by mechanical and chemical polishing.

8. The method of claim 6, wherein the conductive material layer is formed of a material selected from the group consisting of tungsten, copper, aluminum, refractory metal and refractory metal silicide.

9. The method of claim 1, wherein forming the conductive layer comprises:

forming a conductive material layer over the second ILD film coated with the adhesive layer such that the groove of the second ILD film and the recession of the lower plug are completely filled; and etching the conductive material layer until the top of the second ILD film is exposed.

10. The method of claim 9, wherein the conductive material layer is etched by one of (i) mechanical and chemical polishing and (ii) dry etching.

11. The method of claim 1, wherein the lower plug is formed of a material selected from the group consisting of aluminum, copper and tungsten.

12. The method of claim 1, wherein the single diameter of the recession is ¼–½ of the diameter of the opening of the first ILD film.

* * * * *